United States Patent [19]

Severns

[11] 4,419,532

[45] Dec. 6, 1983

[54] THERMOPHOTOVOLTAIC POWER SOURCE

[75] Inventor: James G. Severns, Alexandria, Va.

[73] Assignee: The United States of America as represented by the Secretary of the Navy, Washington, D.C.

[21] Appl. No.: 403,838

[22] Filed: Jul. 30, 1982

[51] Int. Cl.³ .................................................. H01L 31/04
[52] U.S. Cl. ..................................... 136/253; 136/293
[58] Field of Search ............................. 136/253, 293

[56] References Cited

U.S. PATENT DOCUMENTS

| | | | |
|---|---|---|---|
| 3,751,303 | 8/1973 | Kittl | 136/253 |
| 3,929,510 | 12/1975 | Kittl | 136/247 |
| 4,234,352 | 11/1980 | Swanson | 136/253 |
| 4,313,024 | 1/1982 | Horne | 136/253 |
| 4,316,048 | 2/1982 | Woodall | 136/253 |
| 4,331,829 | 5/1982 | Palazetti et al. | 136/253 |

OTHER PUBLICATIONS

"Photovoltaic Solar Energy Conversion Using High Temperature Thermal Reservoirs", National Science Foundation Document No. NSF-RA-N-74-013 based on Conference, Oct. 23-25, 1973.
"Design Analysis of TPV Generator System", 25th Annual Proceedings Power Sources Conference, May 1972.

*Primary Examiner*—Aaron Weisstuch
*Attorney, Agent, or Firm*—Robert F. Beers; William T. Ellis

[57] ABSTRACT

A thermophotovoltaic power source comprising a Cassegrain solar collector and concentrator, a thermal vessel including a containment vessel holding thermal storage material therein, the containment vessel having the shape of an annulus closed at one end and disposed with its open end in registry with an aperture in the thermal vessel, with a selective band radiating layer coating the internal surface of the annulus cavity, and further including an external array of photovoltaic cells mounted on a cooled cylinder disposed for insertion by a positioning motor to a desired depth into the annulus cavity and thus into adjacency with the selective band radiating layer. Concentrated solar energy is applied by the solar collector through a second aperture into the thermal vessel to heat the thermal storage material in the containment vessel and thereby cause the selective radiating layer to radiate energy to excite a current in the photovoltaic array. Constant current control and/or load-matching are obtained by varying the degree of insertion of the photovoltaic array into the thermal storage annular cavity.

15 Claims, 5 Drawing Figures

THERMOPHOTOVOLTAIC POWER SOURCE

BACKGROUND OF THE INVENTION

The present invention relates generally to the field of spacecraft power sources, and more particularly to thermophotovoltaic power sources.

There is a continuing interest in the spacecraft arts in finding a power supply which is more durable and reliable than the standard solar cell panels presently utilized. Solar cell power supplies are of concern because they are subject to severe performance degradation from charged particles. Since future space missions will be required to operate in the Van Allen belts which contain large numbers of geomagnetically trapped electrons and protons, the use of solar cell panels for such missions will be severely limited. In addition, the solar cells are also susceptible to degradation due to the charged particles generated by solar flare events. Finally, solar cell panels will be susceptible to performance degradations due to energetic electron emission from floating radioactive debris in the event of atomic weapon detonations in the atmosphere during wartime.

Radioisotope energy sources have been considered as alternatives to the solar cell panels currently in use. However, the complexity of final fabrication, integration, and launch operations in combination with the risk of an accidental unplanned spacecraft dissent with such a radioactive power source mediates against the use of such an energy source.

Nuclear powered thermoelectric and thermionic systems have been considered as alternative power supplies. However, these types of electric energy conversion techniques require the energy conversion element to operate at extremely high temperatures. These high temperatures place a major limit on useful lifetimes of the power supplies and also pose major reliability problems.

The energy converting element of a thermovoltaic power source, in contradistinction to the above, operates at near room temperature and thus promises high reliability over a long service lifetime. Thus, thermophotovoltaic power supplies are being actively considered for use aboard spacecraft. A thermophotovoltaic power supply typically consists of a moderately high density energy source in intimate thermal contact with a radiating surface, to thereby raise the radiator temperature to substantial values, usually above 1,000 K. The thermal radiation from this hot surface then falls upon an array of photovoltaic cells, which converts a portion of this energy to useful electric power. The photovoltaics, which differ from the more well-known solar cells in that they are designed to respond optimally to the thermal radiation spectrum instead of the solar spectrum, are typically kept at moderate operating temperatures (e.g., room temperature) by the use of a waste heat elimination system.

The present system utilizes solar radiation as the primary energy source. Accordingly, one of the problems with such a system is that the primary energy input to the device will diminish to zero when the spacecraft is in that portion of its orbit where the sun is eclipsed by the earth. Additionally, such a solar powered system suffers from the inability to adjust its operating level with the load. Without a provision for varying the operating level, the system must be designed with the highest load anticipated, thereby wasting power during lower load periods.

OBJECTS OF THE INVENTION

Accordingly, it is an object of the present invention to provide a solar powered energy source which is capable of providing power during the entire space craft orbit including the eclipse period.

It is a futher object of the present invention to provide a thermophotovoltaic power supply operating on solar radiation with an operating level which can be varied in accordance with the load requirements placed on the system.

It is yet a further object of the present invention to provide a constant voltage maintenance capability and a load matching capability to a solar thermophotovoltaic power supply.

It is still a further object of the present invention to provide a solar powered power supply which is not susceptible to degradation from trapped charged particles in the atmosphere.

It is yet a further object of the present invention to provide a spacecraft power supply which operates at moderate temperatures thereby insuring a long life and high reliability.

Other objects, advantages, and novel features of the present invention will become apparent from the detailed description of the invention, which follows the summary.

SUMMARY OF THE INVENTION

Briefly, the present invention comprises a light energy concentrator and collector, and a thermal vessel including a thermal storage medium disposed in a portion of the vessel and having a light aperture therein for introducing light energy from the concentrator into the vessel so that it impinges on the thermal storage medium. A hot selective band radiating layer is disposed on a portion of the surface of the thermal storage medium for radiating energy in a small predetermined wavelength band when heated by the storage medium. An array of photovoltaic cells is positioned so that it may be disposed adjacent the selective radiating layer, these cells having a maximum spectral response approximating the predetermined wavelength band of the selective radiating layer. Finally, a positioning circuit is included to move the photovoltaic array into and out of adjacency with the selective radiating layer. This positioning circuit allows a constant current and/or load matching by controlling the degree of adjacency of the photovoltaic array with the selective radiating layer.

In one embodiment the thermal storage material may be shaped to have a cavity in a portion there of sufficient size so that the photovoltaic array may be inserted therein. The selective radiating layer may then be disposed in the interior walls of this cavity, and the positioning circuit may be operable to move the photovoltaic array into the cavity of any desired depth.

DETAILED DESCRIPTION OF THE PREFERRED EMBODIMENT

Figure 1:
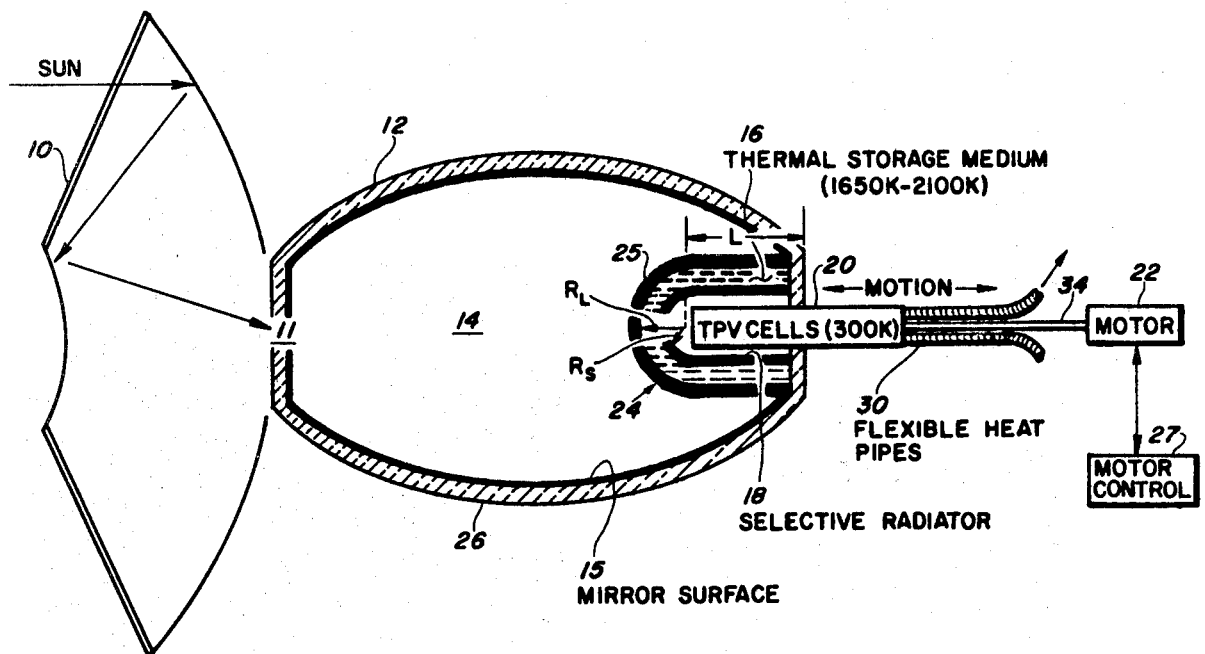
FIG. 1 is a cross-sectional view of one embodiment of the thermophotovoltaic power supply of the present invention.

Referring now to FIG. 1, the thermophotovoltaic power supply shown therein comprises a light energy collector and concentrator 10 for concentrating light radiation through an aperture 11 into a thermal vessel 12. The thermal vessel 12 includes a reflective cavity 14 and a thermal storage medium 16 contained in a containment vessel 24 with a selective band radiator coating 18 disposed on one surface of the containment vessel. An array of photovoltaic cells 20 is designed to be inserted into the thermal vessel and into adjacency with the selective radiator layer 18. A positioning motor 22 is included in order to vary the degree of insertion of the photovoltaic array 20 into the thermal vessel 12, thereby varying the degree of adjacency of the array 20 with the selective radiating layer 18.

In operation, solar energy is concentrated by the collector and concentrator 10 through the aperture 11 and into the reflective cavity 14 of the thermal vessel 12. The reflecting cavity 14 has highly reflective walls 15. The outer wall 25 of the containment vessel 24 has a blackened surface facing the reflective cavity 14. Accordingly, sunlight entering the reflective cavity 14 will be reflected therein until it is absorbed by the blackened outer surface 25 of the containment vessel housing the thermal storage medium 16. This thermal storage medium 16 may comprise a high temperature melting material (1650–2200 K.), for storing energy during the eclipse portion of the orbit of the spacecraft. The contained thermal storage material 16 begins to melt as the solar energy is absorbed thereby. Heat is then transferred by radiation, conductive and possibly convection to the surface of the containment vessel 24 which is coated by the selective radiator 18. This selective radiator 18 radiates most of its thermal energy in a small wavelength band. This narrow band radiation illuminates the array of protovoltaic cells 20 which operate to convert the radiant energy to electrical form.

Referring now to the individual elements, the collector and concentrator 10 may be formed utilizing a Cassegrain collecting system. Such systems are well known in the art. The walls 15 of the reflecting cavity 14 are thin and lightweight and may be built of either a refractory metal or a ceramic coated with a metal. The inner surface of these walls forming the reflecting cavity 14 must be highly reflective, in essence, a mirror surface, providing a minimum absorptance. The outer or exterior surface of the reflective cavity walls 15 may be coated with multiple layers of radiative insulation 26.

The outer surface of the containment vessel 24 holding the thermal storage material should be blackened as noted above, so that its absorptance is as high as possible. This blackening feature insures that the only low thermal impedance path for concentrated solar energy entering the reflective cavity 14 is into the thermal storage containment vessel 24. This thermal storage containment vessel is filled with a melting-freezing material 16. The desired properties for such a thermal storage material are an appropriate melting temperature, high heat of fusion per Kg., high thermal conductivity, good liquid heat transfer characteristics, reasonably high density at liquidus, and an easy containment characteristic. In the present embodiment, melting temperatures in the range of 1650–2200 K. have been chosen. By way of example, materials which may be utilized for thermal storage in this approximate temperature range are silicon, $Li_2O$, and some of the eutectic oxides, for example, $Al_2O_3$-BeO, $Al_2O_3$-CaO, and MgO-$TiO_2$. Additional materials that are good candidates as thermal storage materials are $Be_2B$, $Al_2O_3$-$Na_2O$ eutectic, CaO-$TiO_2$, $LiAlO_2$($Li_2O$-$Al_2O_3$), $Si_3N_4$, $SiB_6$, $Al_2O_3$-MgO eutectic, $Al_2O_3$, Boron, and BeO-MgO eutectic. These materials change state from solid to liquid in the above temperature range and thereby store a significant amount of energy per unit volume. It should be noted that as an alternative to energy storage via melting, a molecular dissociation process could be utilized.

The thermal storage containment vessel 24 is shown, by way of example, as being shaped to have a cavity opposite one wall of the thermal vessel 12 in order to allow the insertion of the photovoltaic cells 20. Accordingly, FIG. 1 shows a thermal storage containment vessel 24 as having an annular shape with one end closed and one end open for insertion of the photovoltaic array. In essence, the containment vessel 24 may be formed by attaching a small radius hemisphere to one end of a small radius cylinder and then inserting that structure coaxially into an identical larger radius structure. The actual dimensions and material chosen for this thermal storage containment vessel 24 depend on the thermal storage material to be used.

In order to obtain an estimate of the size of the required components, the orbit parameters and the regulated load must be specified. In essence, the orbital period and the maximum eclipse time specify the system. After adding losses due to regulation and concentrator pointing, the electrical output required from the photovoltaic array can be determined. For a given cell efficiency, the radiated thermal load required from the selective radiators disposed on the interior of the annulus may be determined. The size of the thermal storage containment vessel is determined by the requirement that the load be provided by the thermal storage vessel for the duration of the longest eclipse period plus providing for conductive and radiative heat losses. In essence, enough power must be provided during the sunlit portion of the orbit in order to support the load, feed the thermal losses, and melt the storage medium.

As an example, a regulated load of 1KW is assumed for an orbit period of 720 minutes with a maximum eclipse time of fifty-four minutes. It can be determined that an absorbing cavity aperture 11 of 3.2 centimeters in diameter is sufficient. A Cassegrainian concentrator of overall diameter of 3.2 meters is then capable of focusing approximately 8 killowatts of energy through this 3.2 centimeter aperture. The required thermal storage capacity is found by taking the product of the total thermal load and the longest eclipse time. If a high temperature storage is desired, then an oxide eutectic $Al_2O_3$-BeO (21.6% $Al_2O_3$) which melts at 2180 K. with a heat fusion estimated at 1570 Joules/gm and densities in the liquid and solid state (at 2108) of 2.701 gm/cm$^3$ and 3.025 gm/cm$^3$. In the example, 15.3 killograms of this eutectic will be required, and if a 6% safety factor is used, then 16.3 kilograms will be required in a molten volume of $6.04 \times 10^{-3}$m$^3$. Using the oxide eutectic as the storage material, a molybdenum thermal storage containment vessel 24 may be utilized. By way of example, the dimensions for the annular vessel may be as follows: the radial dimension $R_L$ from the inside of the outer hemisphere containment wall is 0.12 m; the outer radial dimension $R_S$ for the inner hemisphere containment wall is 0.07 m, the length of the cylindrical portion of the vessel L is 0.19 m, and the containment vessel walls may have a thickness of 0.00317 m. Typically, the cavity into which photovoltaic array 20 is inserted is maintained in a vacuum.

If a lower temperature storage medium is desired, then silicon which melts at 1683 K., with a heat of fusion of 1800 Joules/gm may be utilized. The solid and liquid densities of silicon are 2.288 g/cm$^3$ and 2.54 g/cm$^3$, respectively. Utilizing these densities and including a safety factor, approximately 12.9 Kg should be utilized in a volume of $5.65 \times 10^{-3}$m$^3$. If silicon is to be used as the storage material, then it may be stored in a containment vessel 24 made of silicon nitride. The dimensions for this vessel may be $R_L=0.12$ m, $R_S=0.07$ m, and $L=0.09224$ m. The thermodynamic equations utilized to determine the foregoing vessel dimensions may be found in the paper by Severns and Cobble entitle "A Spacecraft Thermal Photovoltaic Power Source With Thermal Storage," Proceedings of the 16th Intersociety Energy Conversion Conference, ASME, 1981, pages 89–94.

Figure 2:
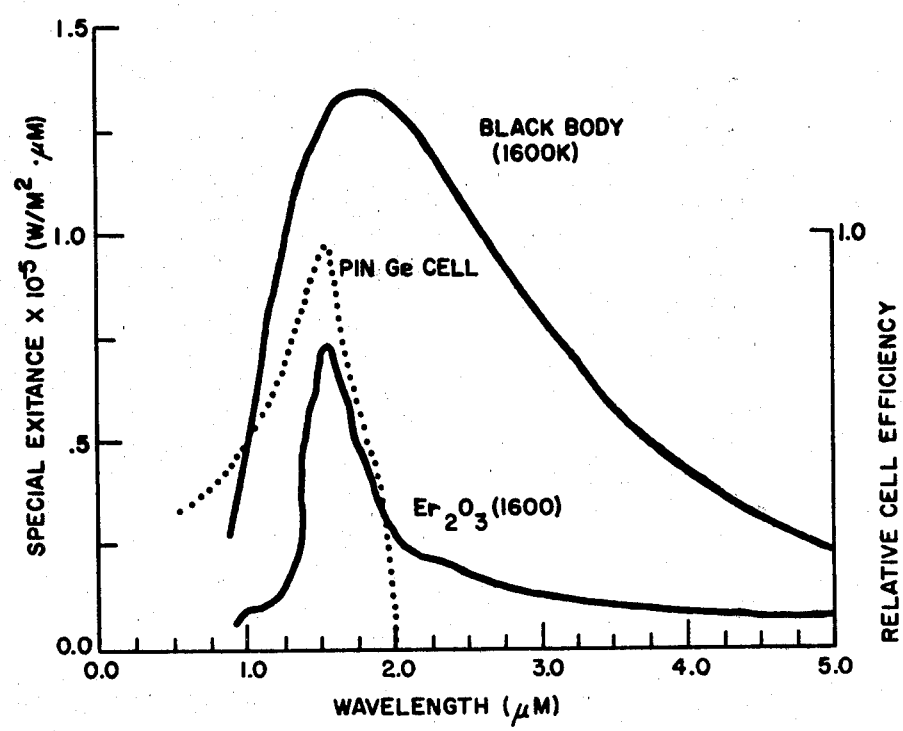
FIG. 2 is a graph of the spectral exitance for a black body of 1600 K., $ER_2O_3$ (1600 K.) and a PIN diode Ge cell.

The choice of the selective radiating coating and the photovoltaic cells must be made together. As is well known, the efficiency of any photovoltaic cell varies with the wavelength of the incident light radiation. The efficiency will be a maximum for the particular wavelength having light quanta with an energy just greater than the semiconductor bandgap. Light energy of a longer wavelength cannot be utilized by the semiconductor material to generate a current and thus merely contributes heat to the semiconductor which must be removed. Light energy of a shorter wavelength is used by the semiconductor to generate electrical current, but is used at a proportionately reduced efficiency. Additionally, the surplus energy of the photons at the short wavelengths is again converted to heat in the semiconductor cell and must be removed. Accordingly, it is important for proper operation to obtain a good spectral match between the response of the particular semiconductor photovoltaic cell chosen and the selective radiator. By way of example, the array of photovoltaic cell may be made of germanium, either of the PIN construction, or the vertical multijunction type. The spectral response for a germanium photovoltaic cell is plotted with respect to wavelength in FIG. 2 (the dotted line). In order to obtain a spectral match with this germanium response, the selective radiator $ER_2O_3$, or thorium oxide doped with $ER_2O_3$ may be utilized. It can be seen from the spectral excitance plot of FIG. 2 that $ER_2O_3$ is a relatively good spectral match to germanium. Accordingly, the photovoltaic germanium cell will convert most of the selective radiation falling on it from the selective radiator 18 into electrical energy.

The germanium photovoltaic array 20 is mounted on the outer surface of a cylinder for ease of insertion into the annular cavity formed by the thermal storage containment vessel 24. Since the germanium should be kept at room temperature, i.e. approximately 30° C. or less, a system for removing waste heat must be included. Such a system may simply be comprised of a set of flexible heat pipes 30 running through one side of the interior of the photovoltaic cylinder and then running out the other side. The liquid running in these flexible heat pipes 30 may then be conducted to a waste heat radiator (not shown), which may be the skin of the spacecraft. By way of example, the waste heat pipes may conduct ammonia therethrough to carry away the heat. One possible design for such heat pipes is described in a NASA Report CR-137724 entitled "Investigation of an Inverted Meniscus Heat Pipe Work Concept" by E. W. Saaski, dated August 1975.

As noted above, one of the principal purposes of the present invention is to provide the ability to match the electrical output of the photovoltaic cells with the load and/or to provide the ability to maintain a constant current. If the photovoltaic cells 20 were merely inserted fully into the thermal storage annular cavity at all times, the electrical output therefrom would vary depending on what portion of the orbit the spacecraft was currently in and its relation to the eclipse period. In order to solve this problem, the photovoltaic cylinder is coupled mechanically to a motor 22 which may be utilized to move the cylinder into and out of the thermal storage cavity. By way of example, the coupling of the motor 22 may be via a lead screw arrangement 34, or with a rack and pinion design. The only constraint placed on the coupling mechanism is that the photovoltaic cylinder not rotate but move along its axis.

The motor 22 may be controlled by an electronic motor control circuit 27 that continuously monitors the photovoltaic operating level and the load required, and then drives the motor to position the photovoltaic array to obtain a balance therebetween.

A variety of control schemes may be utilized to control the positioning of the photovoltaic array 20 via the motor 22. The scheme chosen and disclosed herein is based on the monitoring of the voltage on the power supply bus as the load varies in order to control the motor 22.

Figure 3:
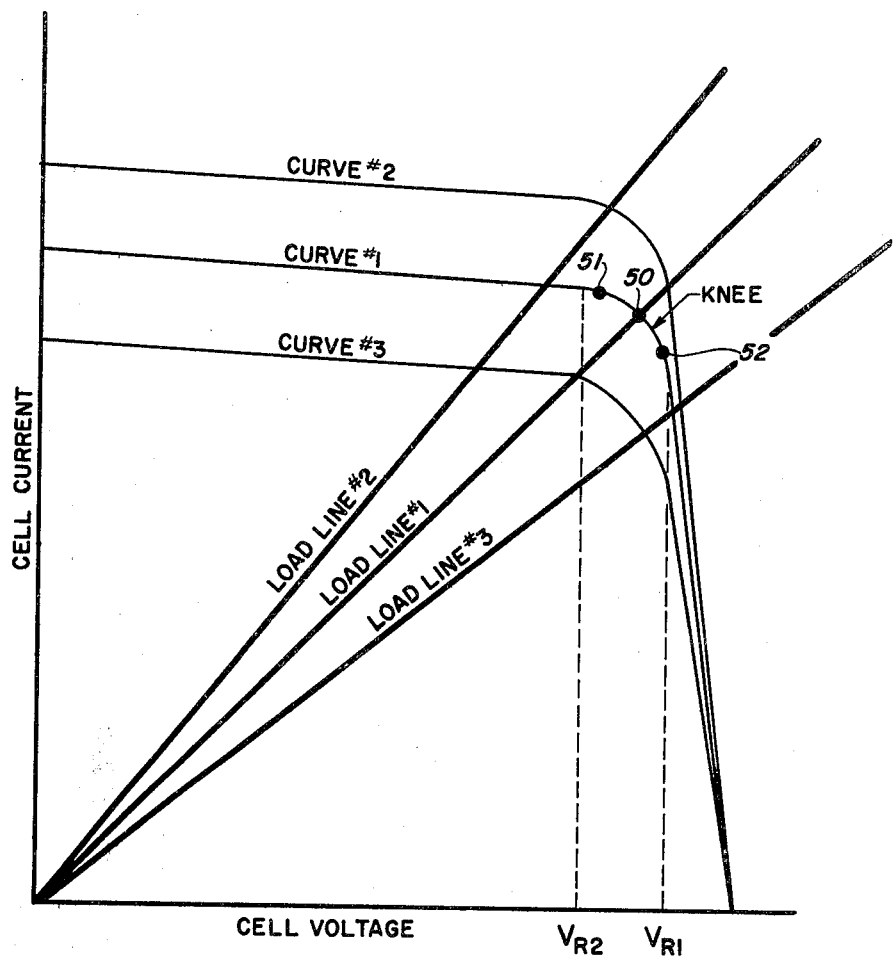
FIG. 3 is a graph of the current-voltage characteristic for these different photovoltaic array positions.

In order to better understand this voltage monitoring scheme, reference is now made to FIG. 3 which shows the current-voltage characteristic for the photovoltaic array at three different array positions represented by curves #1, #2 and #3. The current-voltage characteristic of curve #1 is taken as the reference curve. It is well known that it is advantageous to operate the array near the knee of its current-voltage curve, since the point at which the maximum power (and hence maximum efficiency) is obtained is near that knee. The load line 1 for curve #1 passes directly through the knee of curve #1.

When the load on this thermophotovoltaic power supply changes, the attendant load line will change, and either rotate toward load line #2 or load line #3. Changes in the load can be understood as follows. The different loads in the system are generally connected in parallel across the thermophotovoltaic power supply. When a new load is switched into the system, it is connected in parallel across the power supply, thereby decreasing the impedance which the power supply sees. This decrease in impedance causes the current to increase. From a review of the current-voltage characteristic #1 for a standard photovoltaic cell, it can be seen that an increase in current from the point 50 to a new point 51, for example, will result in a decrease in voltage. Likewise, if a load is taken away from the power supply, the impedance seen at the power supply increases. Such an impedance increase causes a current decrease to a point 52, for example, on the current-voltage curve #1. Accordingly, this decreased current results in an increased array voltage. It can thus be seen that load changes across the power supply will move the operating point of the photovoltaic array away from the "knee" of the current-voltage characteristic curve. Likewise, it can be seen that this change in the operating characteristic of the array can be monitored by monitoring the power supply bus voltage.

Figure 4:
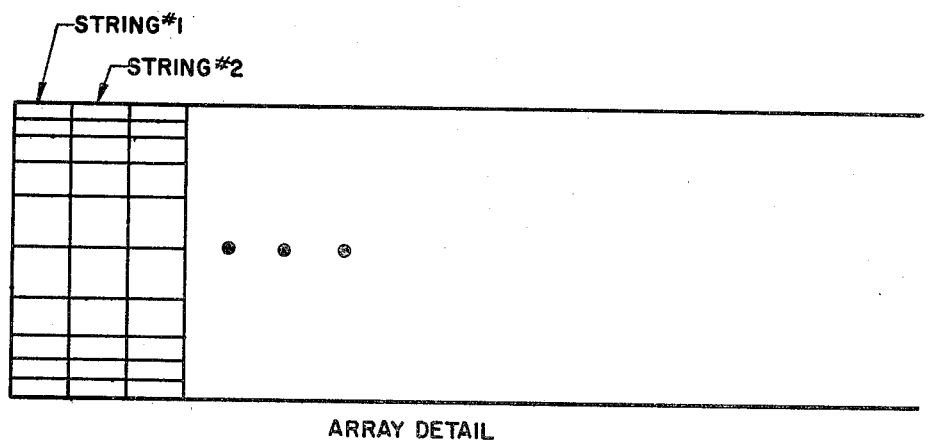
FIG. 4 is a side view showing the individual cell strings in the photovoltaic array.

From the above, it can be seen that it is highly desirable to be able to vary the current-voltage characteristic of the photovoltaic array power supply in order to obtain an intersection of the load line at the knee of the current-voltage characteristic. The purpose of the present design is to accomplish this current-voltage characteristic change by changing the amount of adjacency of the photovoltaic array 20 to the selective radiator layer 18. There are a variety of connection patterns of the photovoltaic cells which could be used to facilitate the foregoing change in the current-voltage characteristic when the array is moved laterally into the cavity inside the containment vessel 24. By way of example, the individual photovoltaic cells in the array can be connected to form a plurality of series connected "strings" of cells. Each string comprises a number of cells connected in series with these cells being physically mounted around a circumference of the array cyclinder 20. Thus, each physical circuit of cells around the cyclinder 20 comprises a string as illustrated in FIG. 4. Each string along the length of the array cyclinder 20 is connected in parallel with all of the other strings thereon. As the array 20 is moved into or out of adjacency with the radiating surface 18 in the cavity, the number of strings which are illuminated also changes. This change in the number of strings illuminated varies the amount of load current that can be obtained from the array. The array voltage required for the system loads will dictate the number of cells needed in each string and will place a constraint on the size of the individual cells and the array substrates around the cyclinder 20.

In operation, when the array is moved so that more strings are illuminated, the operating characteristic will change from curve #1 in FIG. 3, to curve #2. Similarly, if the array is moved so that fewer strings are illuminated, the operating characteristic will change from curve #1 to curve #3. Accordingly, it can be seen that if the load changes to load line #2, the array operating voltage and efficiency will drop unless the current-voltage characteristic is likewise changed to curve #2 by increasing the number of cell strings illuminated. Likewise, it can be seen that if the load changes to load line #3, the voltage increases and the efficiency drops unless the current-voltage characteristic is also changed to curve #3 by decreasing the number of cell strings being illuminated.

Figure 5:
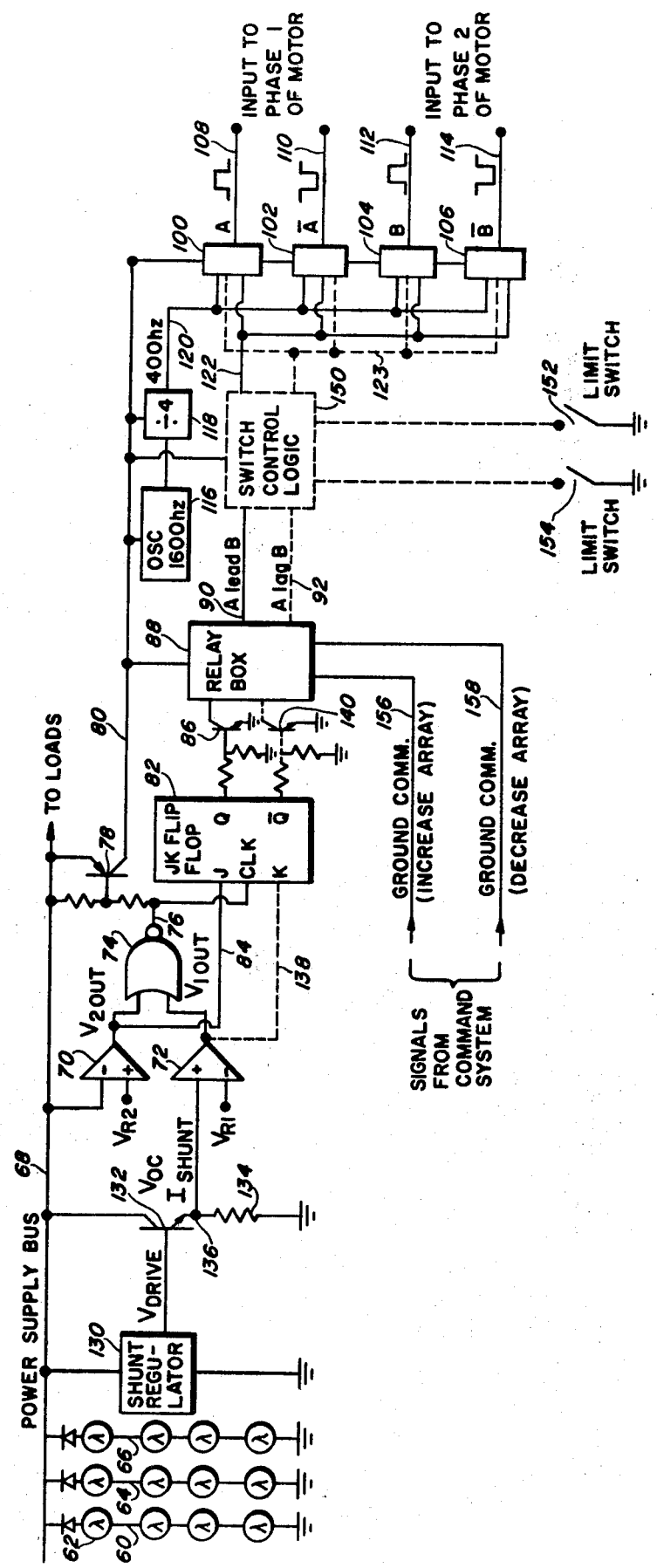
FIG. 5 is a schematic circuit diagram of an embodiment of the photovoltaic array positioning motor control circuit 27.

As noted above, the change in the array bus voltage is used to sense an overloaded condition (array voltage lowered), or an underloaded condition (array voltage increased). One embodiment of a circuit configuration which may be utilized to implement this voltage monitoring function is shown in FIG. 5. In the figure, three cells strings 60, 64, and 66 are shown for purposes of illustration. Each string is made up of photovoltaic cells 62. The current generated in each cell string is applied on a power supply bus line 68 to the various loads. Two differencing devices 70 and 72 are provided for comparing the voltage on this power supply bus line 68 to reference voltages $V_{R2}$ and $V_{R1}$. In essence, if the array voltage on the bus line 68 falls below $V_{R2}$, the circuit operates to actuate the motor to increase the number of strings being illuminated on the array. Likewise, if the voltage on the bus line 68 rises above $V_{R1}$, the circuit operates to decrease the number of strings being illuminated on the array.

The circuit of FIG. 5 will first be discussed in the context of a bus line voltage on the line 68 below the $V_{R2}$. With the bus voltage below $V_{R2}$, the differencing device 70, which may be implemented with a differential amplifier, will go to a +1 level (since the voltage on the noninverting terminal is more positive than the voltage on the inverting terminal) to thereby positively drive a NOR gate 74. The NOR gate 74 will thus have its output on line 76 go to 0. The output line 76 from the NOR gate 74 is connected through a resistor to the base of a transistor 78 which controls the power to the remainder of the motor control circuit on the line 80. The line 76 is also connected to the clock input of a JK FLIPFLOP 82. The low voltage on the line 76 causes two actions: the transistor 78 is biassed into a conducting condition, causing current to flow from the power supply bus line 68 to the power line 80 for the motor control; and the edge-triggered JK FLIPFLOP is gated. It can be seen that the output from the differential amplifier 70 is also applied via the line 84 to the J input of the JK FLIPFLOP 82. Thus, since the voltage output from the amplifier 70 in this situation is a positive voltage, the voltage at the J input is a digital "1," thereby causing the Q output of the FLIPFLOP 82 to go positive. The Q output of this FLIPFLOP is connected to the base of a transistor 86. Thus, the positive Q output in this case biasses the transistor 86 into conduction. Current conducted through the transistor 86 causes a relay box 88, which comprises a set of standard relays, to cause the line 90 labeled "A lead B" to go to "1. " The output on the line 92 from the relay box labeled "A lag B" is "0."

The motor 22 is actually controlled by the voltage pulse signals from four identical pulse forming networks 100, 102, 104, and 106, via the lines 108, 110, 112, and 114 respectively. These pulse forming networks are simply push-pull amplifiers with input gates for applying the signals from a square wave generator to their respective output lines. In this case, the square wave generator may be comprised of an oscillator 116 oscillating at the frequency 1600 hertz and a divider 118 for dividing this frequency by 4. The square wave output on line 120 has a frequency of 400 hertz and is applied to one input of each of the pulse forming networks 100, 102, 104, and 106. The pulse forming network 100 generates a pulse A of one polarity while the pulse forming network 102 generates an in-phase pulse A of the opposite polarity. Likewise, the pulse forming network 104 generates a pulse B of one polarity while the pulse forming network 106 generates a pulse B which is in phase with respect thereto but of opposite polarity. The push-pull amplifiers of the pulse forming networks are set to be phase sensitive to the 1 or 0 input on line 122 in such a way that the A and A outputs from the lines 100 and 102 will lead the B and B pulse outputs from the lines 104 and 106 by 90° in phase for the "1" condition. Likewise, the A and A outputs will lag the B and B outputs by 90° for the "0" condition. The A and A outputs on the lines 108 and 110 respectively, are connected to the inputs for phase 1 of the motor 22. The resultant signal at the phase input 1 of the motor is a square wave which is the difference between the outputs A and A. Likewise, the B and B outputs from the lines 112 and 114, respectively, are connected to the phase 2 inputs of the motor 22. Thus, the motor 22 will see a square wave input which is the difference between the outputs B and B. When the square wave at the 1 phase inputs to the motor 22, i.e. the A and A inputs, leads by 90° the inputs to the phase 2 of the motor 22, i.e. the B and B inputs, then the motor will turn the screw 34 in one direction. Likewise, when the square wave input to the phase 2 input of the motor leads the square wave to the phase 1 input of the motor by 90°, then the motor 22 will turn the screw 34 in the opposite direction. Thus, it can be seen that the resultant two square waves from the four inputs 108, 110, 112, and 114 provide the inputs to a synchronous motor which will turn in opposite directions depending on the phase relationship between the input signals.

Referring again to the relay box 88, when the voltage $V_{R2}$ is greater than the voltage on the power supply bus line 68, then the voltage on line 90 will be high, or a "1." This voltage may be applied to directly to the line 122 to cause the outputs A and A to lead the outputs B and B by 90°. This will cause the motor to turn the screw to move the array of photovoltaic cells out of the cavity.

Referring now the situation where the voltage on the bus line 68 rises above the voltage $V_{R1}$ (see FIG. 3), this will be sensed by the differential amplifier 72. More specifically, a standard shunt regulator 130 is provided to bias a transistor 132, which in turn, is connected to the noninverting input of the differential amplifier 72. In essence, the shunt regulator 130 senses when the voltage on line 68 is too high and places an impedance in parallel with the array in such a situation, lowering the effective impedance that the array sees and drawing more current. The result of the action is to drive the voltage down. The shunt regulator 130 is connected to the base of the transistor 132 via the $V_{DRIVE}$ line and controls the conduction of current from the collector to the emitter thereof in accordance with the voltage on the bus line 68. The line $V_{DRIVE}$ is essentially a tap on a potentiometer. When the current drawn by the shunt regulator increases, the voltage difference across the potentiometer increases thereby increasing the voltage on the line $V_{DRIVE}$. Shunt regulators of the type described above are well known, and may be purchased from a variety of companies, such as Arco Solar, SpectroLab, and Power Tech, simply by specifying the solar array to be regulated. When the current conducted through the transistor 132 and the resistor 134 to ground is such that the voltage at the point 136 rises above the voltage $V_{R1}$ on the inverting terminal of the amplifier 72, then the amplifier 72 generates a positive output. The output from the amplifier 72 is connected to one input of the NOR gate 74. Accordingly, the NOR gate 74 will again generate a 0 output which will bias the transistor 78 into conduction. The current being conducted through the transistor 78 from the bus line 68 will then supply power on the line 80 to the remainder of the motor control circuits. Thus, the oscillator 116 and the divide-by-4 118 would be energized as well as the pulse forming networks 100, 102, 104, and 106. Thus, square waves would be applied on each of the output lines 108, 110, 112, and 114. However, since the J input to the JK FLIPFLOP 82 is low, the transistor 86 will not be biassed into conduction, and the relay box 88 will have a low voltage on the line 90. Thus, the line 122 will be low and the square wave across B and B will lead the squarewave across A and A by 90°. Thus, the synchronous motor 22 will rotate the screw 34 in the opposite direction from when the line 122 was high.

It can be seen that when the voltage on the bus line 68 is between the voltages $V_{R1}$ and $V_{R2}$ the NOR gate 74 will not be energized. Thus, no power will be supplied via the line 80 to the relay box, the pulse forming circuits, or the oscillator 116.

A truth table is provided at the end of the specification in order to summarize the foregoing logic functions.

It may desirable to include various additional logic functions in the circuit. For example, it may be desirable to provide a limit switch to prevent the motor from continuing to operate once the array has extended fully into the cavity. Likewise, it may be desirable to have a limit switch to turn off the motor when the array has been fully retracted. Such logic may be simply implemented by inserting a switch control logic box 150 shown in dashed lines in the figure. The switch control logic would be controlled by the line 90 labeled "A lead B" and the line 92 labeled "A lag B" generated from the relay box 88 and would provide outputs on line 122 and line 123 (shown in dashes) to the pulse forming networks 100, 102, 104, and 106. The generation of a logic signal on the line 90 has already been discussed. The generation of a logic signal on the line 92 may simply be implemented by connecting the output from the amplifier 72 to the K input of the JK FLIPFLOP 82 via the line 138 and then connecting the Q output of the FLIP-FLOP 82 through a transistor 140 to the relay box 88. Thus, when the output from the amplifier 72 is high, causing the K input and the Q output of the FLIPFLOP to be high, then the transistor 140 is biassed into conduction. Current through transistor 140 causes line 92 from the relay box 88 to have a logic "1" therein. The limit switches 152 and 154 are shown connected to the switch control logic 150. Both of these switches are normally open. When the motor has extended the array fully into the cavity, limit switch 152 closes. This closure of switch 152 acts to disable the application of the logic "1" signal on the line 122. Likewise, when the array 20 has been extracted fully from the cavity, the switch 154 closes thereby disabling the application of a logic "1" voltage on the line 123. There are a variety of switch logic gate configurations which could be utilized to implement this disable function. By way of example, limit switch line could be applied as one input to an AND gate with the other input being the "A lead B" line 90. The output from the AND gate would then be applied as one input to a NAND gate with the other input being the "A lead B" line 90. The output from the NAND gate is applied to line 122. Accordingly, when the limit switch line is open, then the AND gate will have a logic "0" output, and the NAND gate will act to pass all of the "1" signals from the "A lead B" line 90 to the line 122. When the limit switch is closed, the AND gate will have a logic "1" output whenever the "A lead B" line is a logic "1," thereby ensuring that the NAND gate output is a logic "0." Thus, the "A lead B" line logic "1" signals are not passed to the line 122. An identical AND-NAND gate configuration can be used for the other limit switch line 154 and the "A lag B" line 92 to control the application of the logic "1" signals to the line 123.

It should be noted that provision can be made for a ground command override of the system. In the embodiment shown in FIG. 5, a signal from a receiver (not shown) in the system may be provided on the line 156 to the relay box 88 in order to increase the number of cell strings in the array which are in adjacency with the selective radiator surface 18. Likewise, a signal from the receiver may be applied to the relay box 88 via the line 158 in order to decrease the number of cell strings in the array which are in adjacency with the selective radiator surface.

Thus, it can be seen that with the above described system, the rate at which energy is withdrawn from the thermal storage can be lowered in times of low power demand or increased during times of high power demand. Accordingly, this design significantly increases the efficiency of the photovoltaic power supply.

It should be noted that certain radiative energy losses will result through the small annular space between the cylindrical array 20 and the walls of the thermal vessel 12. These radiative losses may be significantly reduced by extending the multi-layer insulation of the walls of vessel 12 to form a "skirt" which almost touches the cylindrical array 20 and induces the annular opening of the selective radiator cavity.

As noted previously, the present solar design with its thermal storage has the advantage that it can provide electrical energy during an entire orbit including the eclipse period of the orbit. The insertion control for the photovoltaic array provides the system with a load matching capability and the ability to maintain a constant current. Additionally, as the photovoltaic array is partially withdrawn, less energy is absorbed by the array. Thus, although the radiation rate is constant for the selective radiator, the reabsorbtion of the radiation by the heated walls of the selective radiator will rise. Thus the net rate at which energy is removed from the thermal storage medium will decrease.

It should also be noted that the photovoltaic cells are inside the thermal vessel which in turn, is disposed within a sattelite. Thus, in comparison to conventional solar cells, these photovoltaic cells have significantly greater protection from trapped charged particle environments.

As noted before, the use of this system design permits the operation of the photovoltaic cells at very near room temperature thus promising a much longer lifetime than thermoelectric or thermionic systems.

There are a variety of design choices available for the above-described system. For example, terbium oxide could be utilized to form the selective radiator coating 18. Alternative material candidates for the photovoltaic cells are the III-V semiconductors. Another promising alternative is a silicon photovoltaic cell used with a selective radiator of $Yb_2O_3$ or thoria doped with $Yb_2O_3$.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A thermophotovoltaic power source comprising:
   a light energy concentrator for collecting light energy and concentrating it in a small area,
   a thermal storage vessel including
   a thermal storage material;
   a containment vessel for holding said thermal storage material therein, said containment vessel being disposed within a portion of said thermal vessel,
   a light aperture for introducing light energy from said concentrator into said thermal vessel so that it impinges on said containment vessel;
   a hot selective band radiating layer disposed on a portion of the surface of said containment vessel for radiating in a small predetermined wavelength band when heated by said thermal storage material; and
   an array of photovoltaic cells positioned so that it may be disposed adjacent said selective radiating layer, said cells having a maximum spectral response approximating the predetermined wavelength band of said selective radiating layer; and
   means for moving said photovoltaic array into and out of adjacency with said selective radiating layer.

2. A thermophotovoltaic power source as defined in claim 1, wherein said thermal storage vessel includes a reflective cavity therein for reflecting the light energy from said aperture on to said containment vessel.

3. A thermophotovoltaic power source as defined in claim 2, wherein said thermal vessel has a second aperture therein;
   wherein said containment vessel is shaped to have a cavity in a portion thereof of sufficient size that said photovoltaic array may be inserted therein, said cavity having an open end thereof in registry with said second aperture in said thermal vessel;
   wherein said selective radiating layer is disposed on the interior walls of said cavity in said containment vessel;
   wherein said photovoltaic array is disposed externally of said thermal vessel; and
   wherein said moving means is operable to move said external photovoltaic array through said second aperture and into said containment vessel cavity.

4. A thermophotovoltaic power source as defined in claim 3, wherein
   said photovoltaic array is mounted on a cooled cylinder; and
   wherein said moving means includes a positioning motor for inserting said photovoltaic array to a desired depth into the cavity in said thermal storage material.

5. A thermophotovoltaic power source as defined in claim 4, wherein said moving means further comprises a motor controller which generates control signals to control said positioning motor in accordance with the load requirements on the power source.

6. A thermophotovoltaic power source as defined in claim 5, wherein said reflecting cavity is coated with a highly reflective material and the surface of said containment vessel facing said reflective cavity is blackened for high absorptance.

TRUTH TABLE

|  | AMP 70 | AMP 72 | NOR 74 | TRANS 78 | J | K | Q | $\overline{Q}$ | TRANS 86 | LINE 122 |
|---|---|---|---|---|---|---|---|---|---|---|
| $V_{R2} > V_{array}$ | High | 0 | 0 | ON | 1 | 0 | 1 | 0 | ON | 1 |
| $V_{R2} < V_{array} < V_{R1}$ | 0 | 0 | 1 | OFF | 0 | 0 | 0 | 0 | OFF | 0 |
| $V_{array} > V_{R1}$ | 0 | High | 0 | ON | 0 | 1, | 0 | 1 | OFF | 0 |

7. A thermophotovoltaic power source as defined in claim 1 or 5, wherein said light energy concentrator is operable to collect and concentrate solar energy.

8. A thermophotovoltaic power source as defined in claim 6, wherein said light energy concentrator is a Cassegrain solar collector and concentrator.

9. A thermophotovoltaic power source as defined in claim 8, wherein said selective radiating layer is a $ER_2O_3$ radiator and said photovoltaic array cells are germainium cells.

10. A thermophotovoltaic power source as defined in claim 5, wherein said motor controller includes means for comparing the voltage generated by said photovoltaic array with an overload reference voltage and an underload reference voltage and for generatirng the appropriate control signals to operate said positioning motor to change the amount of insertion of said photovoltaic array into said cavity when an overload or underload condition is present.

11. A thermophotovoltaic power source as defined in claim 10, wherein said containment vessel is in the shape of an annulus closed at one end and with its open end in registry with said second aperture in said thermal vessel for the insertion of said photovoltaic array from a point external of said thermal vessel.

12. A thermophotovoltaic power source as defined in claim 8, wherein said photovoltaic array cells are germanium cells.

13. A thermophotovoltaic power source comprising:
a solar collector and concentrator;
a thermal vessel with first and second apertures therein and including
a thermal storage material;
a containment vessel for holding said thermal storage material therein, said containment vessel having the shape of an annulus closed at one end and positioned within said thermal vessel so that its open end is in registry with the first aperture in said thermal vessel;
wherein said second aperture is positioned in said thermal vessel in order to introduce light from said solar collector and concentrator into said thermal vessel so that it impinges on said containment vessel;
a selective band radiating layer disposed on the internal surface of the annulus cavity; and
an array of photovoltaic cells mounted on a cooled cylinder externally of said thermal vessel and disposed for insertion through said first aperture in said thermal vessel into the annulus cavity to bring the cells into adjacency with the selective band radiating layer; and
a positioning control circuit for inserting the cylinder of photovoltaic cells to a desired depth in the annulus cavity to permit load-matching or the maintainence of a constant current.

14. A thermophotovoltaic power supply as defined in claim 13, wherein said positioning control circuit comprises:
a positioning motor for moving said array into and out of the annulus cavity of said containment vessel; and
a motor control circuit for comparing the voltage generated by said photovoltaic array with an overload reference voltage and an underload reference voltage and generating an appropriate control signal to operate said positioning motor to change the amount of insertion of said photovoltaic array into said cavity when an overload or underload condition is present.

15. A thermophotovoltaic power supply as defined in claim 14, wherein said thermal storage vessel includes a reflective cavity for reflecting light energy from said second aperture on to said containment vessel.

* * * * *